United States Patent
Taniguchi et al.

(10) Patent No.: US 6,812,066 B2
(45) Date of Patent: Nov. 2, 2004

(54) SEMICONDUCTOR DEVICE HAVING AN INTERCONNECTING POST FORMED ON AN INTERPOSER WITHIN A SEALING RESIN

(75) Inventors: Fumihiko Taniguchi, Kawasaki (JP); Akira Takashima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 223 days.

(21) Appl. No.: 10/278,940

(22) Filed: Oct. 24, 2002

(65) Prior Publication Data

US 2003/0042564 A1 Mar. 6, 2003

Related U.S. Application Data

(62) Division of application No. 09/843,912, filed on Apr. 30, 2001, now Pat. No. 6,489,676.

(30) Foreign Application Priority Data

Dec. 4, 2000 (JP) .................................... 2000-368910

(51) Int. Cl.[7] .............................................. H01L 21/44
(52) U.S. Cl. ........................ 438/121; 438/124; 438/127
(58) Field of Search ........................... 438/51, 64, 109, 438/121, 124–127

(56) References Cited

U.S. PATENT DOCUMENTS

| | | | |
|---|---|---|---|
| 5,200,809 A | * 4/1993 | Kwon | ........................ 257/707 |
| 5,726,493 A | 3/1998 | Yamashita et al. | |
| 5,886,408 A | * 3/1999 | Ohki et al. | ................... 257/720 |
| 6,239,496 B1 | 5/2001 | Asada | |
| 6,303,997 B1 | 10/2001 | Lee | |
| 6,329,915 B1 | 12/2001 | Brady et al. | |
| 6,331,450 B1 | * 12/2001 | Uemura | ....................... 438/114 |
| 6,348,728 B1 | 2/2002 | Aiba et al. | |
| 6,613,606 B1 | * 9/2003 | Lee | .............................. 438/108 |

FOREIGN PATENT DOCUMENTS

JP          04133451 A    *  5/1992   ............ H01L/23/36

* cited by examiner

*Primary Examiner*—Paul E Brock, II
(74) *Attorney, Agent, or Firm*—Westerman, Hattori, Daniels & Adrian, LLP (57) ABSTRACT

A semiconductor device comprises: a semiconductor element; an external terminal used for an external connection; an interposer having the semiconductor element mounted on a first surface thereof and having the external terminal formed on a second surface thereof opposite to the first surface so as to electrically connect the semiconductor element and the external terminal; a resin sealing the semiconductor element on the first surface; and an interconnecting portion formed within the resin, the interconnecting portion having a first connecting part electrically connected to the external terminal and having a second connecting part exposed on an outer surface of the resin.

6 Claims, 10 Drawing Sheets

SEMICONDUCTOR DEVICE HAVING AN INTERCONNECTING POST FORMED ON AN INTERPOSER WITHIN A SEALING RESIN

The present application is a divisional application of U.S. Ser. No. 09/843,912, filed Apr. 30, 2001, now U.S. Pat. No. 6,489,676.

BACKGROUND OF THE INVENTION

1. Field of the Invention

The present invention generally relates to a semiconductor device and a manufacturing method thereof and, more particularly, to a semiconductor device and a manufacturing method thereof which device provides a three-dimensional structure so as to increase a packaging density thereof.

As an electronic apparatus becomes smaller in size, weight and thickness, a semiconductor device used in such an electronic apparatus is required to be smaller in size and thickness. In an attempt to satisfy these requirements, the trend of a semiconductor device package has been shifting from a QFP (Quad Flat Package) for surface mounting in which package terminals are led out in four directions in the shape of a gull wing, to a BGA (Ball Grid Array) having external connection terminals arranged on the bottom of a package in the form of an area array, or to a CSP (Chip Size Package).

Among semiconductor packages like these, a package of a fan-out type is widely used, in which package a semiconductor chip is mounted on a wiring substrate (an interposer) and external connection terminals are arranged around the semiconductor chip by the interposer.

2. Description of the Related Art

Figure 1:
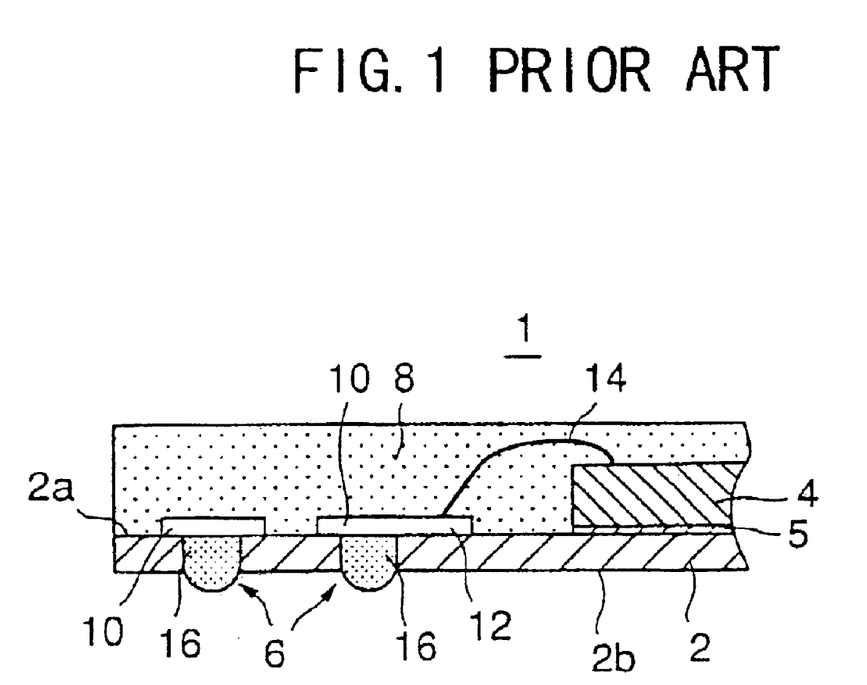
FIG. 1 is a cross-sectional view of a conventional semiconductor device of a fan-out type.

FIG. 1 is a cross-sectional view of a conventional semiconductor device of the fan-out type. In FIG. 1, a semiconductor device 1 mainly comprises a substrate 2, a semiconductor chip 4, solder balls (bumps) 6, and a sealing resin 8. The substrate 2, electrode patterns 10 and a bonding pad 12 compose an interposer. The interposer is used to electrically connect an external electrode and the semiconductor chip 4.

The substrate 2 is formed of such a material as a polyimide resin, a ceramic resin, and a glass-epoxy resin. The substrate 2 has the semiconductor chip 4 mounted on a surface 2a thereof and also has the electrode patterns 10 formed on the surface 2a. The semiconductor chip 4 is fixed faceup on the substrate 2 by a DB material (a bonding pad) 5. The electrode patterns 10 are provided by applying a copper film on the substrate 2 and forming the copper film into predetermined patterns by, for example, etching. The electrode patterns 10 are electrically connected to each other by wiring patterns not shown in the figures.

Some of the electrode patterns 10 are consolidated with the bonding pad 12. The bonding pad 12 and an electrode of the semiconductor chip 4 are connected by a wire 14. Thereby, the semiconductor chip 4, the electrode patterns 10 and the bonding pad 12 are electrically connected via the wire 14 and the wiring patterns. The surface 2a of the substrate 2 is sealed by the sealing resin 8 formed of such a material as an epoxy resin so as to protect the semiconductor chip 4, the wire 14, the bonding pad 5, and the other elements formed on the surface 2a.

Further, a hole 16 penetrating through the substrate 2 is formed at a position facing each of the electrode patterns 10. The hole 16 is formed by processing the substrate 2 by a laser, a drill or a metal mold, etc.

The solder balls 6 are arranged toward a back surface 2b of the substrate 2. Each of the solder balls 6 is placed into the hole 16, and is joined to the electrode pattern 10 through the hole 16. That is, each of the solder balls 6 is fixed to the substrate 2 by being fixed to the electrode pattern 10.

As described above, a package structure using an interposer in the semiconductor device 1 has been becoming a mainstream of a semiconductor device package. However, as a semiconductor device has been made to have an even higher density, a packaging area in a semiconductor package including a semiconductor chip has been becoming smaller. Accordingly, a package size of a semiconductor device is made smaller to the extent that a two-dimensional miniaturization of a package structure is supposedly reaching the limit. Therefore, to realize a further miniaturization of a semiconductor device, a three-dimensional (stack) packaging is required. As an example of the three-dimensional packaging, a semiconductor device having connection electrodes on the upper surface of a resin package is provided.

However, in order to provide connection electrodes on the upper surface of a resin package as mentioned above, wires have to be arranged around the resin package, making it difficult to provide the connection electrodes out on the upper surface of the resin package. For example, in a case where a wire connected to an external terminal formed on an interposer is led to the upper surface of the resin package after the formation thereof by being detoured around the outer surface of the semiconductor device so as to avoid the resin package, the wire becomes exposed and thus is likely to be cut, which impairs the reliability of the semiconductor device. Additionally, with this manner of arranging the connection electrodes, the wires become long so as to increase the impedance thereof, making it difficult for the semiconductor device to operate at high speed.

SUMMARY OF THE INVENTION

It is a general object of the present invention to provide an improved and useful semiconductor device and a manufacturing method thereof in which device the above-mentioned problems are eliminated.

A more specific object of the present invention is to provide a semiconductor device and a manufacturing method thereof which device can be stacked on one another to form a semiconductor device package having a simple three-dimensional structure so as to increase a packaging density thereof.

In order to achieve the above-mentioned objects, there is provided according to one aspect of the present invention a semiconductor device comprising:

a first semiconductor element;

an external terminal used for an external connection;

an interposer having the first semiconductor element mounted on a first surface thereof and having the external terminal formed on a second surface thereof opposite to the first surface so as to electrically connect the first semiconductor element and the external terminal;

a resin sealing the first semiconductor element on the first surface; and an interconnecting portion formed within the resin, the interconnecting portion having a first connecting part electrically connected to the external terminal and having a second connecting part exposed on an outer surface of the resin.

According to the present invention, the interconnecting portion electrically connects the external terminal and an external terminal of another semiconductor device of the same type contacting the second connecting part so that a plurality of the semiconductor devices of the same type can be stacked. That is, the interconnecting portion enables stacking and combining a plurality of the semiconductor devices effectively so as to increase a packaging density of a three-dimensional structure thereof. In addition, wires (including the interconnecting portion) are formed in the resin so as to achieve the shortest wiring, providing a semiconductor device having a simple package structure.

In order to achieve the above-mentioned objects, there is also provided according to another aspect of the present invention a semiconductor device comprising:

a semiconductor element;

an external terminal used for an external connection;

an interposer having the semiconductor element mounted on a first surface thereof and having the external terminal formed on a second surface thereof opposite to the first surface so as to electrically connect the semiconductor element and the external terminal;

a resin sealing the semiconductor element on the first surface; and an interconnecting portion formed on a surface of the semiconductor element within the resin, the interconnecting portion having a first connecting part electrically connected to the semiconductor element and having a second connecting part exposed on an outer surface of the resin.

According to the present invention, the interconnecting portion is formed on the surface of the semiconductor element with the first connecting part being electrically connected thereto so as to increase a degree of freedom in positioning the interconnecting portion.

Additionally, in the semiconductor device according to the present invention, the first connecting part and the second connecting part of the interconnecting portion may have different cross-sectional areas.

According to the present invention, the interconnecting portion can have a smaller total volume by forming one of the first connecting part and the second connecting part smaller than the other, and thus can have a smaller impedance. This increases an operating speed of the semiconductor device. Additionally, the interconnecting portion can be formed in a shorter time. Besides, a connection area between the first connecting part and the external terminal can be made large so as to make the semiconductor device more reliable.

Additionally, the semiconductor device according to the present invention may further comprise a bump formed on the second connecting part.

According to the present invention, the bump formed on the second connecting part increases a reliability in mounting the semiconductor device.

Additionally, the semiconductor device according to the present invention may further comprise a shield mounted on the second connecting part.

According to the present invention, the shield shields noises influencing the semiconductor device, and thus increases a reliability of the semiconductor device.

Additionally, the semiconductor device according to the present invention may further comprise an antenna mounted on the second connecting part.

According to the present invention, the antenna can be used for sending and receiving a radio signal. This enables the semiconductor device to provide a higher performance.

Additionally, the semiconductor device according to the present invention may further comprise an electronic component mounted on the second connecting part.

According to the present invention, an electronic component having various functions can be mounted on the second connecting part so as to increase the ability of the semiconductor device to provide a high performance and to serve a wide range of purposes.

Additionally, the semiconductor device according to the present invention may further comprise a heat sink mounted on the second connecting part.

Additionally, the semiconductor device according to the present invention may further comprise a second semiconductor element, a first surface thereof being connected to the first semiconductor element, and a heat sink mounted on a second surface of the second semiconductor element and the second connecting part.

According to the present invention, the heat sink can be mounted on the back of the semiconductor element and the second connecting part so as to effectively emit a heat generated in the semiconductor device. This enables the semiconductor device to be more reliable and to provide a higher performance.

In order to achieve the above-mentioned objects, there is also provided according to another aspect of the present invention a semiconductor device package comprising:

a plurality of semiconductor devices, each of the semiconductor devices having: a semiconductor element; an external terminal used for an external connection; an interposer having the semiconductor element mounted on a first surface thereof and having the external terminal formed on a second surface thereof opposite to the first surface so as to electrically connect the semiconductor element and the external terminal; a resin sealing the semiconductor element on the first surface; and an interconnecting portion formed within the resin, the interconnecting portion having a first connecting part electrically connected to the external terminal and having a second connecting part exposed on an outer surface of the resin, wherein the semiconductor devices are stacked so that the second connecting part of one of the semiconductor devices is connected to the external terminal of another of the semiconductor devices located immediately above the one of the semiconductor devices.

According to the present invention, a plurality of the semiconductor devices of the same type can be stacked so as to decrease a volume of the semiconductor devices by providing a laminated structure. In other words, the semiconductor devices can have a three-dimensional structure so as to increase a packaging density thereof.

In order to achieve the above-mentioned objects, there is also provided according to another aspect of the present invention a method of manufacturing a semiconductor device, the method comprising the steps of:

arranging a semiconductor element on a surface of a substrate having an electrode pattern;

connecting the semiconductor element and the electrode pattern electrically;

forming a mask on the surface of the substrate, the mask having an interconnection hole at a position corresponding to the electrode pattern, so as to introduce a conductive material into the interconnection hole to form an interconnecting portion on the electrode pattern; and forming a resin on the surface of the substrate after removing the mask so as to seal the semiconductor element and a part of the interconnecting portion, the other part of the interconnecting portion being exposed outward.

According to the present invention, a semiconductor device that can be stacked together with other semiconductor devices of the same type can be manufactured effectively.

In order to achieve the above-mentioned objects, there is also provided according to another aspect of the present invention a method of manufacturing a semiconductor device, the method comprising the steps of:

arranging a semiconductor element on a surface of a substrate having an electrode pattern;

connecting the semiconductor element and the electrode pattern electrically;

forming a resin on the surface of the substrate so as to seal the semiconductor element, the resin having an interconnection hole formed on the electrode pattern; and introducing a conductive material into the interconnection hole so as to form an interconnecting portion within the resin.

According to the present invention, a semiconductor device that can be stacked together with other semiconductor devices of the same type can be manufactured effectively.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments according to the present invention.

Figure 2:
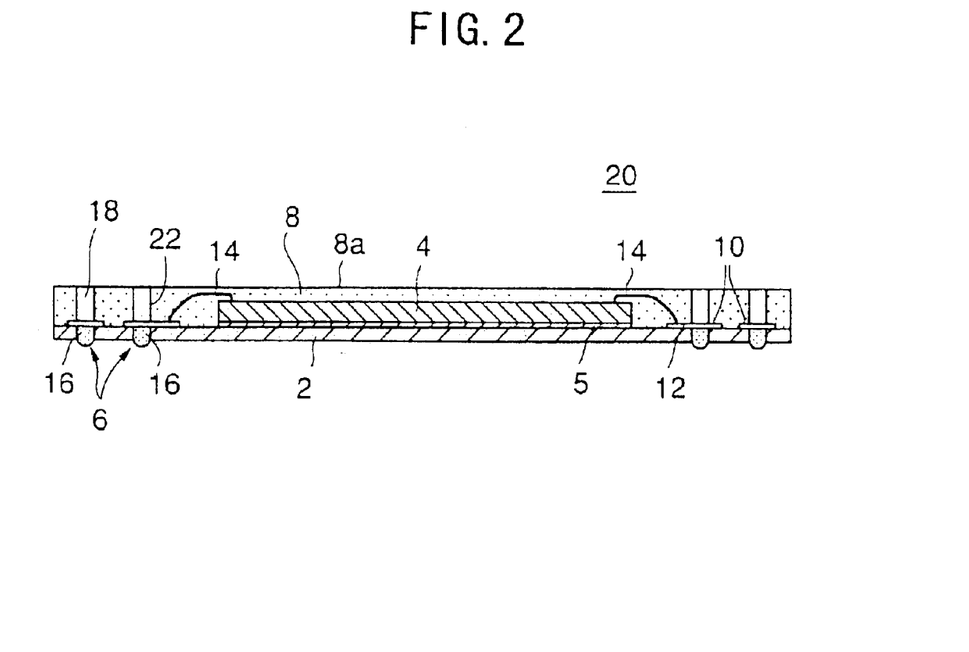
FIG. 2 is a cross-sectional view of a semiconductor device according to a first embodiment of the present invention.

FIG. 2 is a cross-sectional view of a semiconductor device according to a first embodiment of the present invention. A semiconductor device 20 shown in FIG. 2 is a semiconductor device of a fan-out type with wire-bonding connections. Elements in FIG. 2 to FIG. 18 that are identical to the elements shown in FIG. 1 are referenced by the same reference marks, and will not be described in detail.

In FIG. 2, the semiconductor device 20 mainly comprises the substrate 2, the semiconductor chip 4, the solder balls (bumps) 6, the sealing resin 8, and posts (interconnecting portions) 18. The substrate 2, the electrode patterns 10 and the bonding pads 12 compose an interposer.

Each of the posts 18 is provided in the sealing resin 8. The post 18 is connected to the electrode pattern 10 on one end, and is exposed on an outer surface 8a of the sealing resin 8 on the other end. The one end (a first connecting portion) of the post 18 is connected to the electrode pattern 10 so as to be electrically connected to the solder ball 6. The other end (a second connecting portion) of the post 18 is exposed on the outer surface 8a of the sealing resin 8 so as to be capable of being connected to an external terminal of another semiconductor device of the same type. That is, the semiconductor devices can be stacked and combined effectively by the post 18 so as to increase a packaging density of a three-dimensional structure thereof. In addition, wires (including the posts 18) are formed in the sealing resin so as to achieve the shortest wiring, providing a semiconductor device having a simple package structure.

The post 18 is formed, for example, by a high-speed Cu plating method in a post hole 22 formed by such a method as a masking. The sealing resin 8 is formed after the formation of the post 18. Hereinafter, a description will be given in detail of manufacturing processes of the above-described semiconductor device 20.

Figure 3:
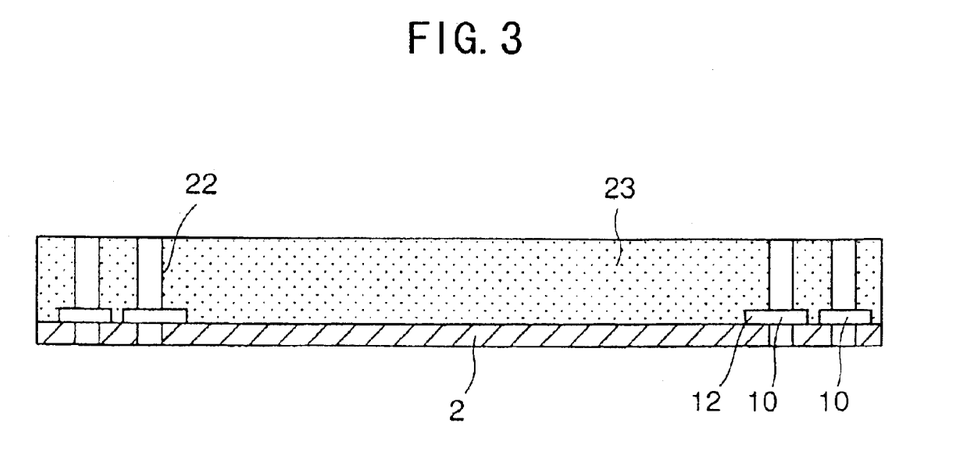
FIG. 3 is a first illustration for explaining a manufacturing process of the semiconductor device according to the first embodiment of the present invention.
Figure 4:
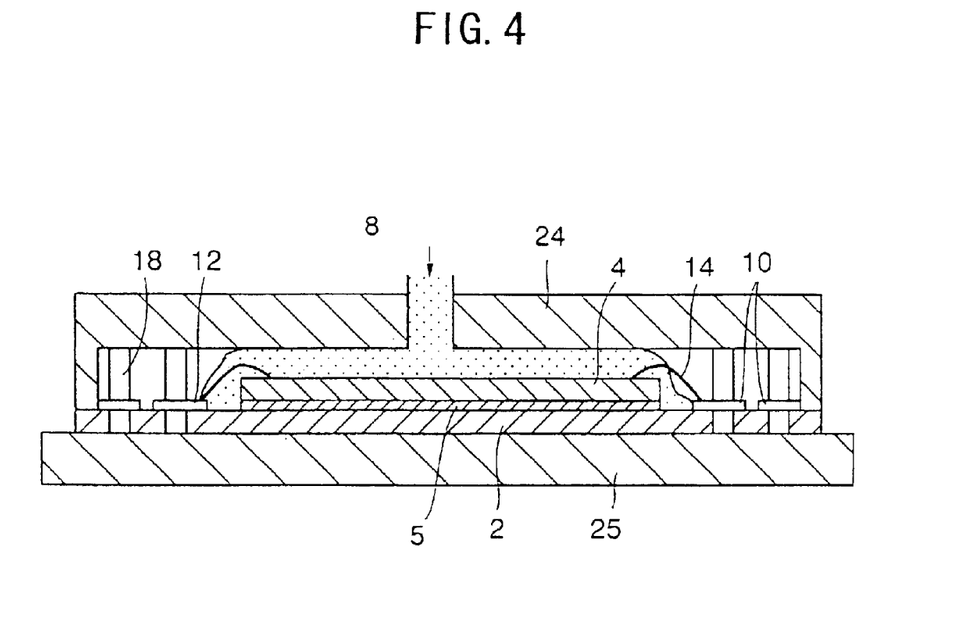
FIG. 4 is a second illustration for explaining the manufacturing process shown in FIG. 3.

FIG. 3 and FIG. 4 are illustrations for explaining a manufacturing process of the semiconductor device according to the first embodiment of the present invention. On the substrate 2 shown in FIG. 3, the post holes 22 are formed in a mask 23 so that each of the post holes 22 adjoins the electrode pattern 10 and has the same depth as the thickness of the sealing resin 8 to be formed. The posts 18 are formed by such a method as a high-speed Cu plating in the post holes 22, as shown in FIG. 4. After the formation of the posts 18, the mask 23 is removed, then metal molds 24 and 25 are arranged on and under the semiconductor device, respectively, and the sealing resin 8 is supplied from an upper opening of the metal mold 24. The above-described process manufactures the semiconductor device 20 shown in FIG. 2.

Figure 5:
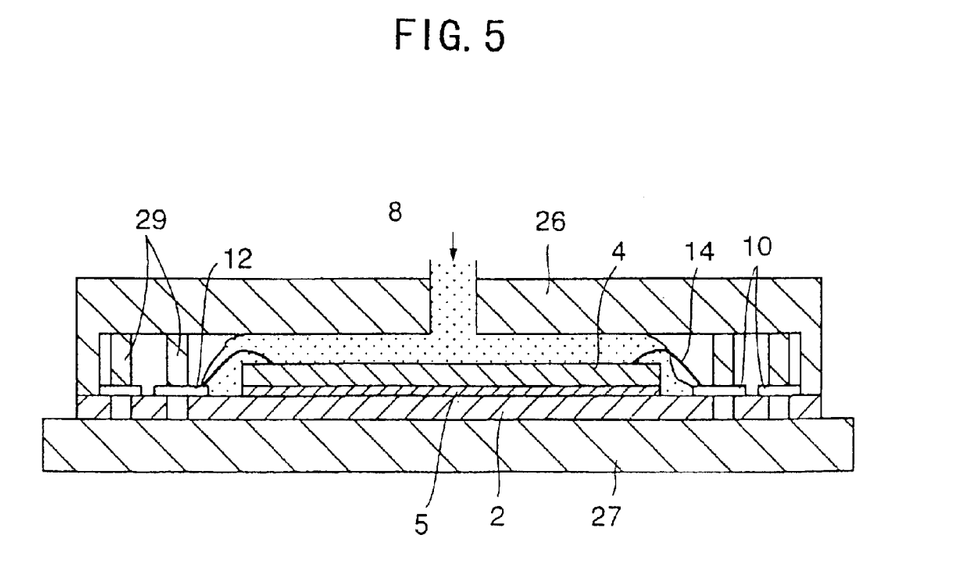
FIG. 5 is a first illustration for explaining another manufacturing process of the semiconductor device according to the first embodiment of the present invention.
Figure 6:
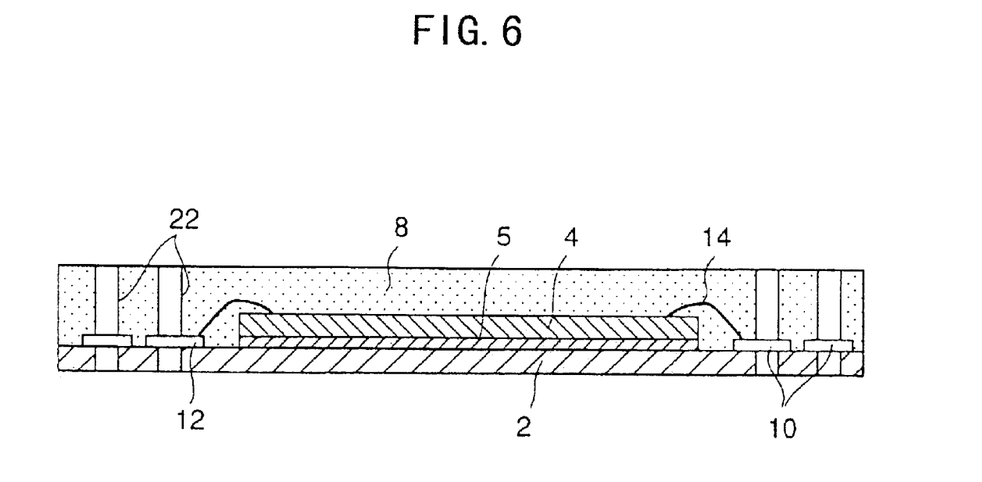
FIG. 6 is a second illustration for explaining the manufacturing process shown in FIG. 5.

FIG. 5 and FIG. 6 are illustrations for explaining another manufacturing process of the semiconductor device according to the first embodiment of the present invention. In the semiconductor device shown in FIG. 5, metal molds 26 and 27 are arranged on the surface of the substrate 2 having the semiconductor chip 4 and the back surface thereof, respectively, and the sealing resin 8 is supplied from an upper opening of the metal mold 26. In this course, the post holes 22 are formed in the sealing resin 8, as shown in FIG. 6, by post-forming portions 29 formed in the metal mold 26 shown in FIG. 5. The posts 18 are formed by such a method as a high-speed Cu plating in the post holes 22. The above-described process manufactures the semiconductor device 20 shown in FIG. 2.

It should be noted that the posts 18 can be formed not only by the high-speed Cu plating, but also by a CVD (Chemical Vapor Deposition) method, a sputtering method, and the like. In addition, the posts 18 can be formed by filling the post holes 22 with a solder ball and a solder paste after the formation of the post holes 22.

Figure 7:
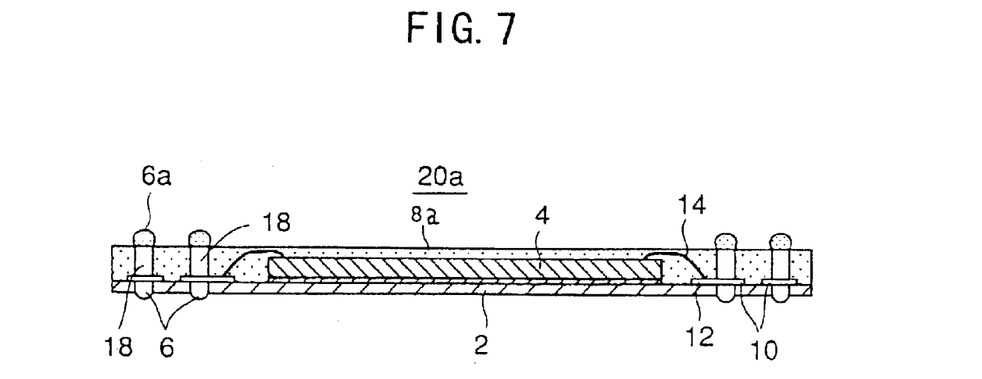
FIG. 7 is a cross-sectional view of a semiconductor device according to a second embodiment of the present invention.

FIG. 7 is a cross-sectional view of a semiconductor device according to a second embodiment of the present invention. A semiconductor device 20a shown in FIG. 7 is manufactured by the manufacturing processes described with reference to FIG. 3–FIG. 4 and FIG. 5–FIG. 6, and further comprises solder balls 6a as external terminals each formed on the end (the second connecting portion) of the post 18 exposed on the outer surface 8a of the sealing resin 8. Forming the solder balls 6a on the posts 18 can increase a reliability in mounting the semiconductor device.

Figure 8:
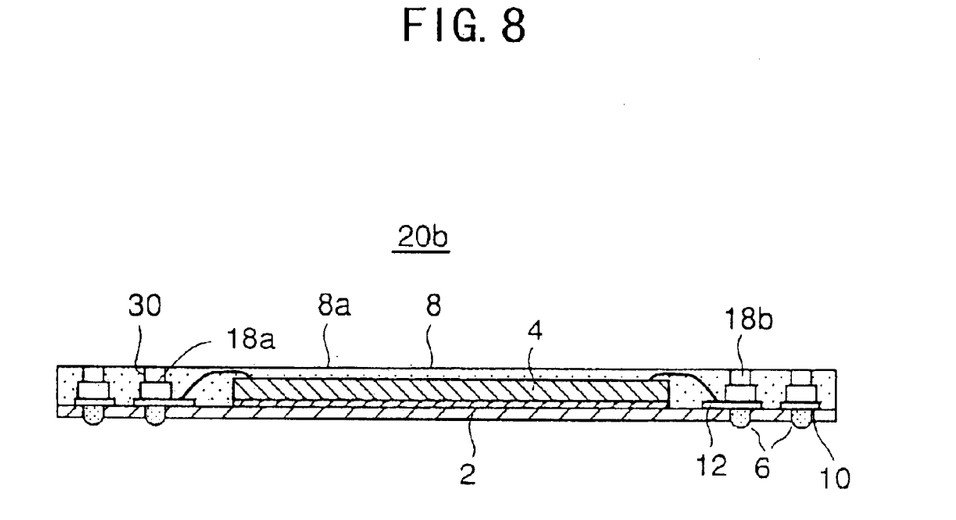
FIG. 8 is a cross-sectional view of a semiconductor device according to a third embodiment of the present invention.

FIG. 8 is a cross-sectional view of a semiconductor device according to a third embodiment of the present invention. A semiconductor device 20b shown in FIG. 8 has posts 18a and posts 18b. The posts 18a are formed in the manufacturing process described with reference to FIG. 3 and FIG. 4 so that each of the posts 18a has a height smaller than the thickness of the sealing resin 8 (lower than the outer surface 8a). After the formation of the posts 18a, metal molds having post-forming portions as show in FIG. 5 are arranged on and under the semiconductor device, and then the sealing resin 8 is supplied in the metal molds so as to form post holes 30 shown in FIG. 8. Then, the posts 18b are formed in the post holes 30 by such a method as a high-speed Cu plating. The post 18a and the post 18b are formed so as to have different cross-sectional areas. Thereby, the two posts as a whole can be formed to have a smaller impedance so as to increase the operating speed of the semiconductor device. Additionally, in a case where the post 18b has a smaller cross-sectional area than the post 18a, as show in FIG. 8, and the post 18b is formed after the formation of the post 18a by such a method as filling a solder paste, a time required to form the post 18b can be greatly shortened. Besides, a connection area between the post 18a and the electrode pattern 10 can be made large so as to make the semiconductor device more reliable.

Figure 9:
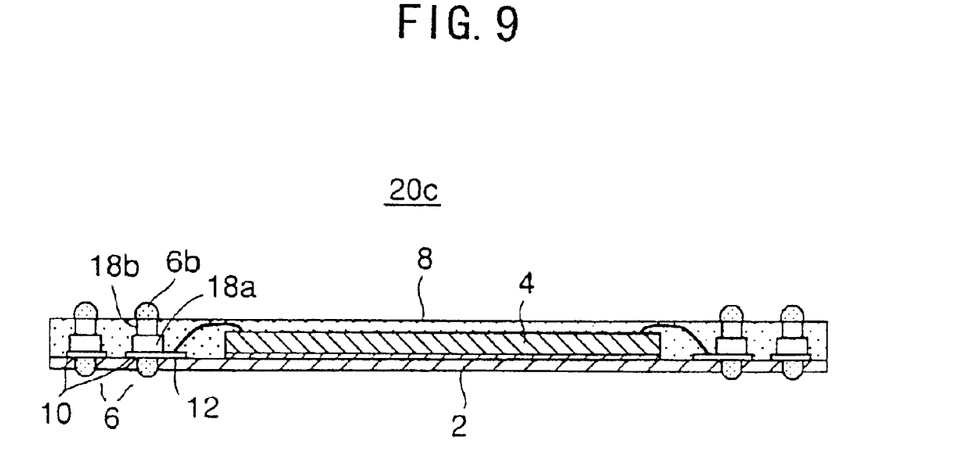
FIG. 9 is a cross-sectional view of a semiconductor device according to a variation of the third embodiment of the present invention.

FIG. 9 is a cross-sectional view of a semiconductor device according to a variation of the third embodiment of the present invention. A semiconductor device 20c shown in FIG. 9 has solder balls 6b each mounted on the post 18b of the semiconductor device 20b shown in FIG. 8. Providing thus the solder balls 6b as external terminals each on an end (a second connecting portion) of the post 18b exposed on the outer surface of the sealing resin 8 can increase a reliability in mounting the semiconductor device. In addition, the posts 18a are formed beforehand by such a method as a Cu plating so as to provide an enough height to mount the solder ball 6b on the post 18b without supplementing a solder paste.

Figure 10:
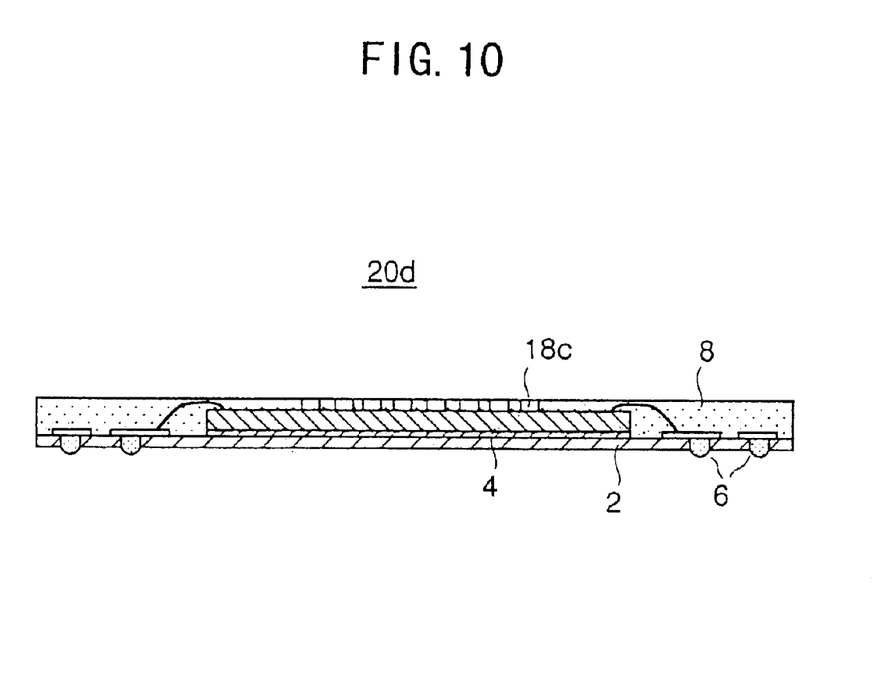
FIG. 10 is a cross-sectional view of a semiconductor device according to a fourth embodiment of the present invention.

FIG. 10 is a cross-sectional view of a semiconductor device according to a fourth embodiment of the present invention. A semiconductor device 20d shown in FIG. 10 has posts 18c formed so that one end (a first connecting portion) of each of the posts 18c is connected to a predetermined position on the surface of the semiconductor chip 4, and the other end (a second connecting portion) of the post 18c is exposed on the outer surface of the sealing resin 8. The posts 18c are formed by such a method as a high-speed Cu plating. Forming thus the posts 18c on the surface of the semiconductor chip 4 expands a degree of freedom in positioning the posts 18c. It is noted that the posts 18c and the semiconductor chip 4 are connected by a wiring formed on the semiconductor chip 4 not shown in the figures.

Figure 11:
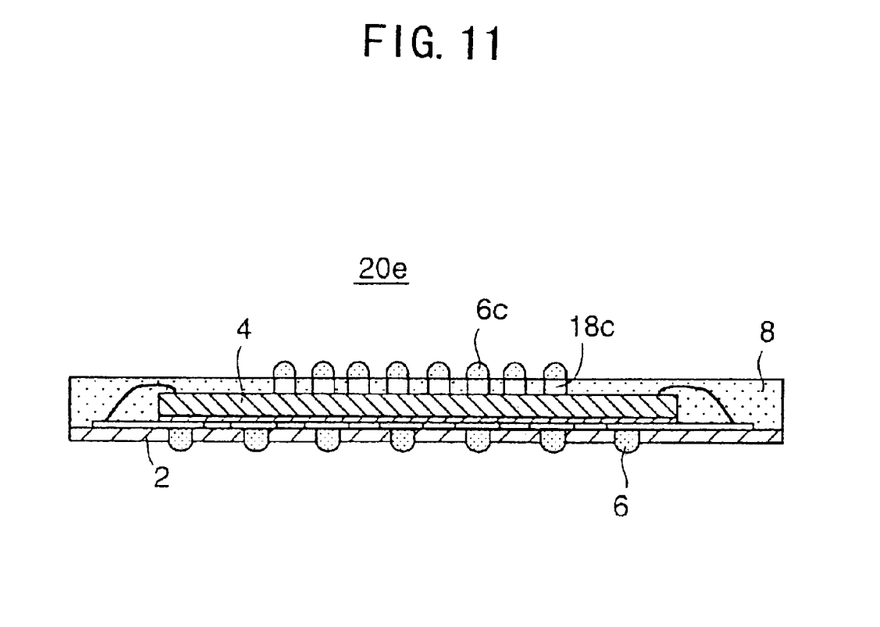
FIG. 11 is a cross-sectional view of a semiconductor device according to a variation of the fourth embodiment of the present invention.

FIG. 11 is a cross-sectional view of a semiconductor device according to a variation of the fourth embodiment of the present invention. A semiconductor device 20e shown in FIG. 11 has solder balls 6c each mounted on the post 18c of the semiconductor device 20d shown in FIG. 10. Providing thus the solder balls 6c on the posts 18c can increase a reliability in mounting the semiconductor device. It is noted here that the manner of forming the posts as shown in FIG. 10 and FIG. 11 is applicable to both a fan-out structure and a fan-in structure.

Figure 12:
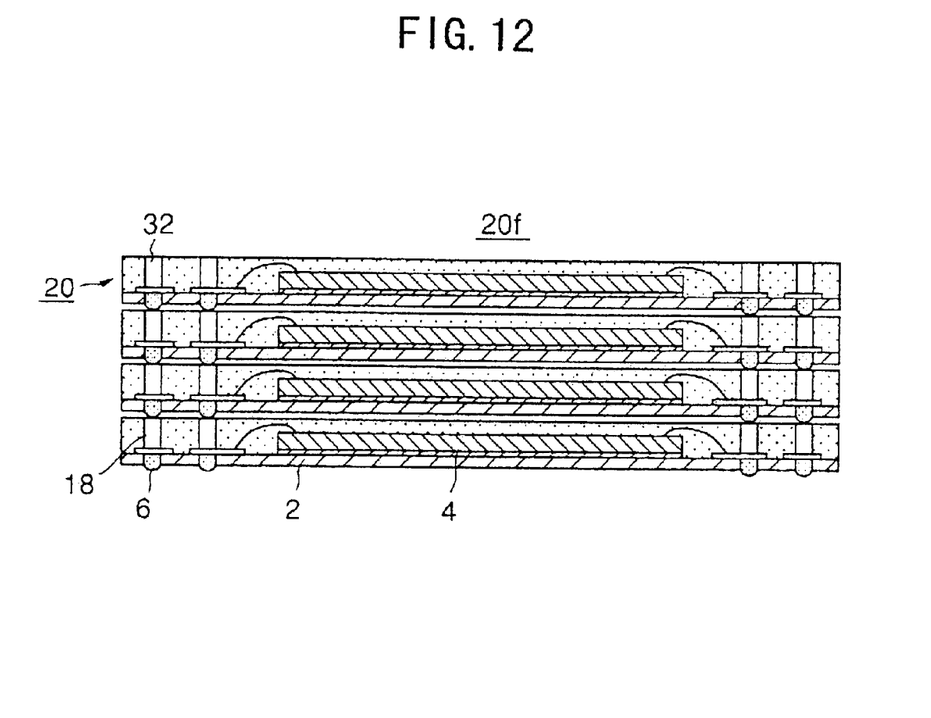
FIG. 12 is a cross-sectional view of a semiconductor device unit according to a fifth embodiment of the present invention.

FIG. 12 is a cross-sectional view of a semiconductor device unit (package) according to a fifth embodiment of the present invention. A semiconductor device unit (package) 20f shown in FIG. 12 has a plurality of the semiconductor devices 20 shown in FIG. 2 stacked on one another so as to form a unit. The plurality of the semiconductor devices 20 can be mounted on one another by connecting the solder ball 6 of one of the semiconductor devices 20 with a connection end-surface 32 of the post 18 of another semiconductor device 20. This structure and the mounting method are effective, for example, in increasing the capacity of a semiconductor element of such a memory IC as a DRAM or a flash memory with a small packaging area.

Figure 13:
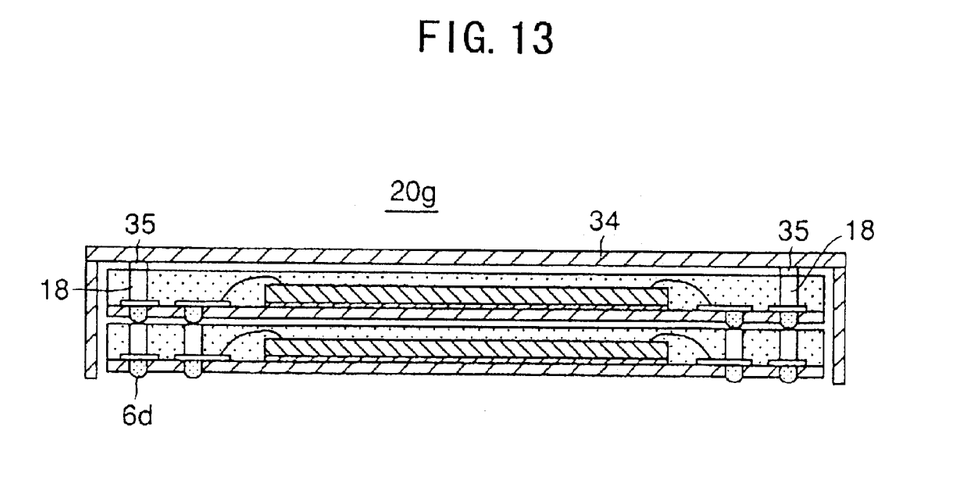
FIG. 13 is a cross-sectional view of a semiconductor device unit according to a sixth embodiment of the present invention.

FIG. 13 is a cross-sectional view of a semiconductor device unit (package) according to a sixth embodiment of the present invention. In a semiconductor device unit (package) 20g shown in FIG. 13, joints 35 connect a package of the stacked semiconductor devices with a shield 34. The shield 34 is connected to the posts 18 of the semiconductor device. Each of the posts 18 is electrically connected to a solder ball 6d. The solder balls 6d are grounded. Thereby, the shield 34 shields an external noise and an internal noise so as to reduce noises influencing the semiconductor device unit 20g and thus increase a reliability of the semiconductor device unit 20g. In addition, the shield 34 can be provided not only for the package of the stacked semiconductor devices but also for a single package of the semiconductor device.

Figure 14:
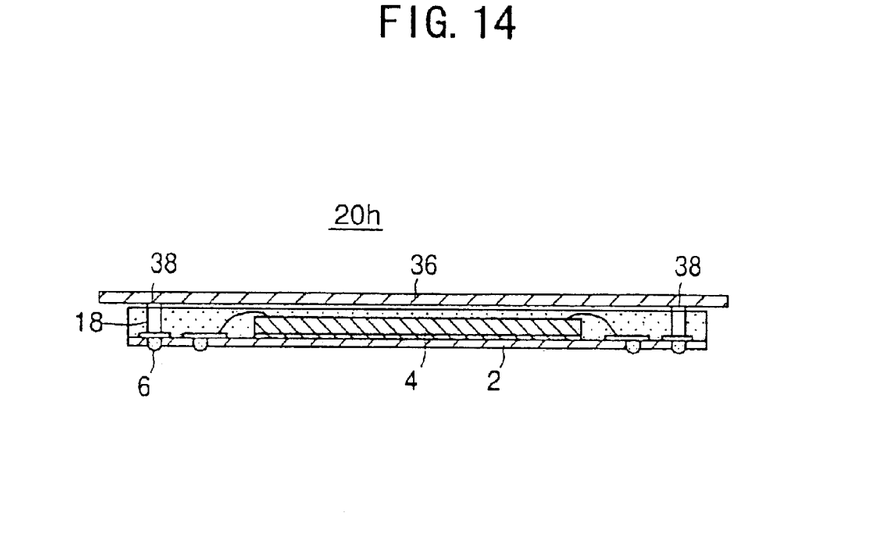
FIG. 14 is a cross-sectional view of a semiconductor device according to a seventh embodiment of the present invention.
Figure 15:
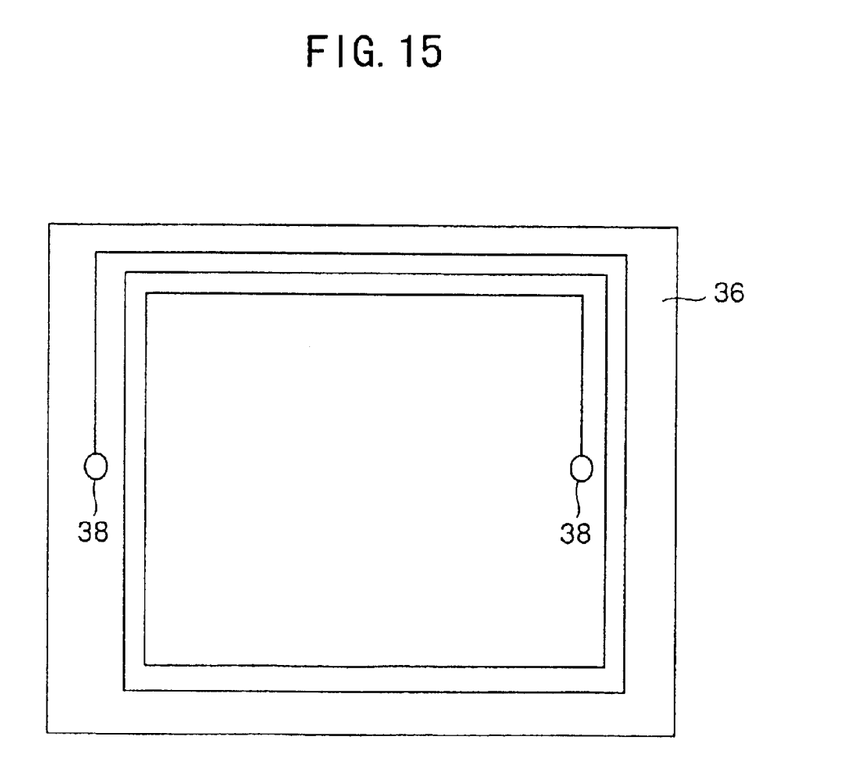
FIG. 15 is a plan view of an antenna provided for the semiconductor device according to the seventh embodiment of the present invention.

FIG. 14 is a cross-sectional view of a semiconductor device according to a seventh embodiment of the present invention. FIG. 15 is a plan view of an antenna 36 provided for the semiconductor device according to the seventh embodiment of the present invention. In a semiconductor device 20h shown in FIG. 14, joints 38 connect the posts 18 and the antenna 36. As shown in FIG. 15, in the antenna 36, a couple of the joints 38 are connected to each other by a wiring. Connecting thus the antenna 36 to the posts 18 of the semiconductor device 20h enables an IC card, an ITS (Intelligent Transport System) and the like to send and receive a radio signal.

Figure 16:
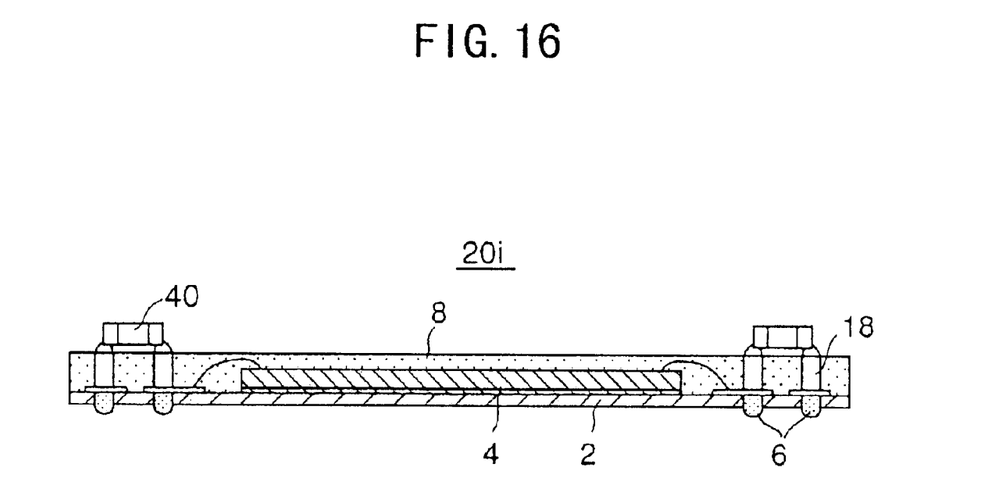
FIG. 16 is a cross-sectional view of a semiconductor device according to an eighth embodiment of the present invention.

FIG. 16 is a cross-sectional view of a semiconductor device according to an eighth embodiment of the present invention. A semiconductor device 20i shown in FIG. 16 has a chip component 40 mounted on the semiconductor device 20 shown in FIG. 2. The chip component 40 is connected to the posts 18 exposed on the outer surface of the sealing resin 8 of the semiconductor device 20i. Connecting thus the chip component 40 to the posts 18 enables the semiconductor device to provide a higher performance and to serve a wider range of purposes.

Figure 17:
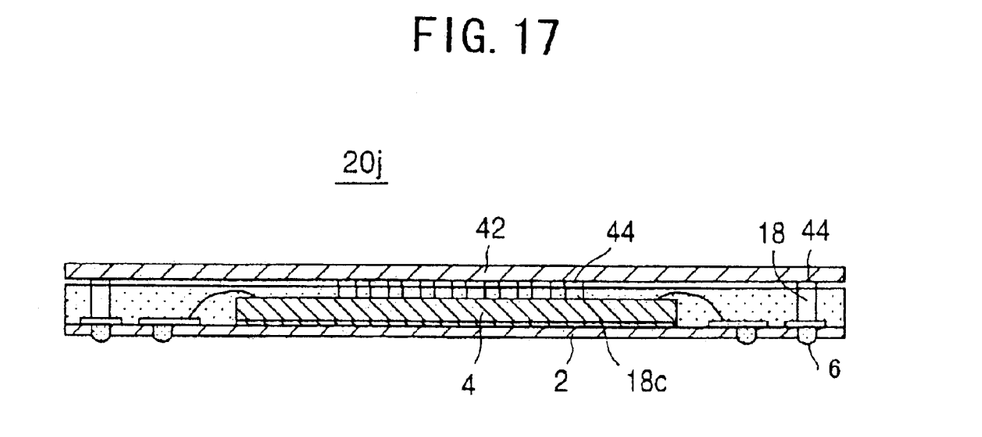
FIG. 17 is a cross-sectional view of a semiconductor device according to a ninth embodiment of the present invention.

FIG. 17 is a cross-sectional view of a semiconductor device according to a ninth embodiment of the present invention. A semiconductor device 20j shown in FIG. 17 has the posts 18 shown in FIG. 2 each connected electrically to the solder ball 6 and the posts 18c shown in FIG. 10 formed on the semiconductor chip 4. Additionally, the semiconductor device 20j has a heat sink 42 connected to the posts 18 and the posts 18c by joints 44. Providing thus the heat sink 42 enables emitting a heat generated in the semiconductor device 20j so as to prevent a temperature rise in the semiconductor device.

Figure 18:
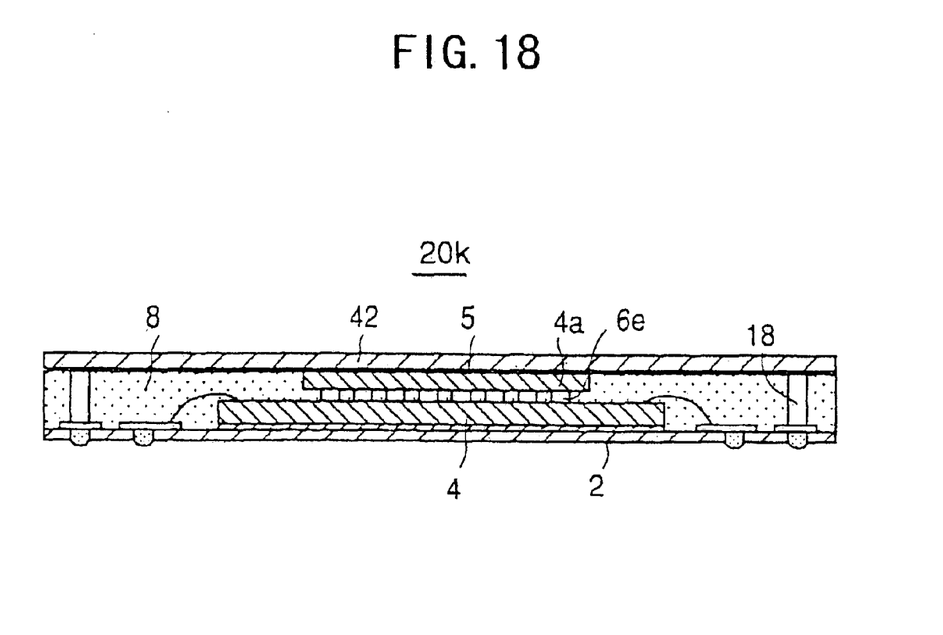
FIG. 18 is a cross-sectional view of a semiconductor device according to a tenth embodiment of the present invention.

FIG. 18 is a cross-sectional view of a semiconductor device according to a tenth embodiment of the present invention. A semiconductor device 20k shown in FIG. 18 has solder balls 6e formed on the semiconductor chip 4, and a semiconductor chip 4a mounted on the solder balls 6e. The back surface of the semiconductor chip 4a is exposed on the outer surface of the sealing resin 8 so as to be connected to the heat sink 42. This enables emitting a heat generated in the semiconductor device effectively. It should be noted that the semiconductor chip 4a does not necessarily have to function electrically, and thus can be replaced by a dummy element for reducing a thermal resistance of the semiconductor device.

The present invention is not limited to the specifically disclosed embodiments, and variations and modifications may be made without departing from the scope of the present invention.

The present application is based on Japanese priority application No. 2000-368910 filed on Dec. 4, 2000, the entire contents of which are hereby incorporated by reference.

What is claimed is:

1. A method of manufacturing a semiconductor device, the method comprising the steps of:

arranging a semiconductor element on a surface of a substrate having an electrode pattern;

connecting said semiconductor element and said electrode pattern electrically;

forming a mask on said surface of said substrate, the mask having an interconnection hole at a position corresponding to said electrode pattern, introducing a conductive material into said interconnection hole to form an electrical interconnecting portion on the surface of said electrode pattern;

removing said mask; and forming a resin on said surface of said substrate after removing said mask so as to seal said semiconductor element and a part of said interconnecting portion, the other part of said interconnecting portion being exposed outward.

2. The method as claimed in claim 1, further comprising forming a bump on the exposed part of said interconnecting portion.

3. The method as claimed in claim 1, further comprising mounting a shield on the exposed part of said interconnecting portion.

4. The method as claimed in claim 1, further comprising mounting an antenna on the exposed part of said interconnecting portion.

5. The method as claimed in claim 1, further comprising mounting an electronic component on the exposed part of said interconnecting portion.

6. The method as claimed in claim 1, wherein conductive material comprises copper metal.

* * * * *